Nov. 24, 1970 M. S. LANE 3,543,184

CONTROLLABLE LOGIC GATE OSCILLATOR

Filed Nov. 27, 1968 2 Sheets-Sheet 1

INVENTOR
M. S. LANE
BY
G. E. Hirsch Jr.
ATTORNEY

Nov. 24, 1970 M. S. LANE 3,543,184

CONTROLLABLE LOGIC GATE OSCILLATOR

Filed Nov. 27, 1968 2 Sheets-Sheet 2

United States Patent Office 3,543,184

Patented Nov. 24, 1970

3,543,184

CONTROLLABLE LOGIC GATE OSCILLATOR

Michael S. Lane, Eatontown, N.J., assignor to Bell Telephone Laboratories, Incorporated, Murray Hill and Berkeley Heights, N.J., a corporation of New York Filed Nov. 27, 1968, Ser. No. 779,512
Int. Cl. H03k 3/282
U.S. Cl. 331—111 5 Claims

ABSTRACT OF THE DISCLOSURE

A precision astable multivibrator is realized by utilizing an inverting logic gate, a delay network and a monostable multivibrator. The duration of the "0" state of the astable multivibrator output waveform is determined by the delay network timing interval and the duration of the "1" state is determined by the monostable timing interval.

This invention relates to oscillator circuits and, more particularly, to precision astable multivibrators.

BACKGROUND OF THE INVENTION

In digital equipment, for example, data processors, telephone systems and the like, precision pulsating signals are employed to control system operation. Generally, both continuous trains of pulses and controlled bursts of pulses are required. Pulsating signals characterized by various repetition rates and duty cycles may be required in different applications.

Because of the large numbers of oscillators used in a given system, it is preferred that a common circuit configuration be utilized which may be modified to perform the various pulse functions as required. If one basic circuit only is employed, greater economy results from the advantageous use of integrated circuitry.

One network utilizes a plurality of logic gates connected in the well-known "ring oscillator" configuration. The timing intervals of this type circuit, however, are fixed, being limited to the inherent propagation delay of the individual gates. In another ring oscillator circuit, some control is effected over its output pulse repetition rate and duty cycle by adjusting a bias applied to individual ones of the gates and by employing a capacitor in the oscillator loop. This circuit, however, does not afford the precision required in many systems applications.

SUMMARY OF THE INVENTION

These and other problems are resolved, in accordance with the invention, in a precision astable multivibrator which includes an inverting logic gate, a delay network and a monostable multivibrator. Selected signals developed in the logic gate, characterized by a given change of state, are delayed in the delay network, while signals characterized by another change of state are propagated without delay. The delayed signals are supplied to trigger the monostable multivibrator. Signals developed at the output of the delay network and at a first output of the monostable multivibrator are applied to control the logic gate, thereby completing the oscillator loop. A second output of the monostable multivibrator yields the desired pulsating output signals.

The "0" state and "1" state intervals of the desired astable pulsating signal are determined by the delay timing interval and the monostable timing interval, respectively. Thus, precise control of pulse repetition rate and duty cycle, in accordance with the invention, may be achieved by adjustment of the individual timing component values of the delay and monostable networks. Additionally, oscillatory action may be inhibited by utilization of an additional input of the logic gate as desired.

These and other objects and advantages of the invention will be more fully understood from the following detailed description of an illustrative embodiment thereof taken in connection with the appended drawings.

BRIEF DESCRIPTION

DETAILED DESCRIPTION

Figure 1:
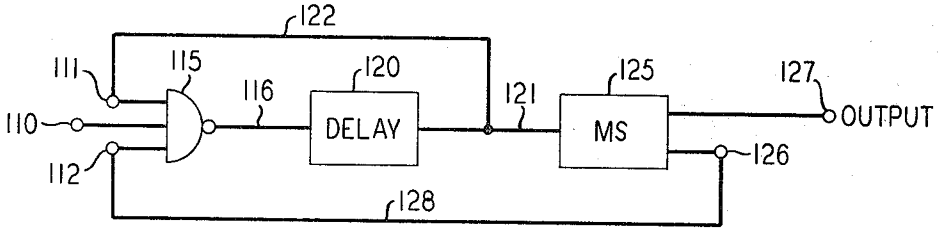
FIG. 1 depicts, in block schematic form, an oscillator that illustrates the invention.

FIG. 1 illustrates a circuit for controllably generating a pulsating signal. NAND GATE 115 is controlled by signals supplied to inputs 110, 111 and 112. Signals at inputs 111 and 112 are internally generated and a suitable initiating signal is supplied to input 110. NAND GATE 115 may be any one of the numerous logic gates known in the art. In its initial state, that is, assuming a signal representative of the low or "0" state applied to either of inputs 110, 111 or 112, a signal developed at the output of NAND GATE 115 at 116 is representative of the high or "1" state. Coincidental application of "1" state signals to inputs 110, 111, and 112 causes a signal developed at the output of NAND GATE 115 to switch, in well-known fashion, to a signal representative of the "0" state. Although NAND GATE 115 is depicted as having three inputs, two are sufficient if continuous oscillatory operation only is desired. Input 110, in this example, is used for inhibiting the oscillatory action as desired. For example, NAND GATE 115 responds only to signals representative of the "1" state on all inputs. Thus, operation of NAND GATE 115 may be inhibited by application of a "0" state signal to input 110.

Figure 3:
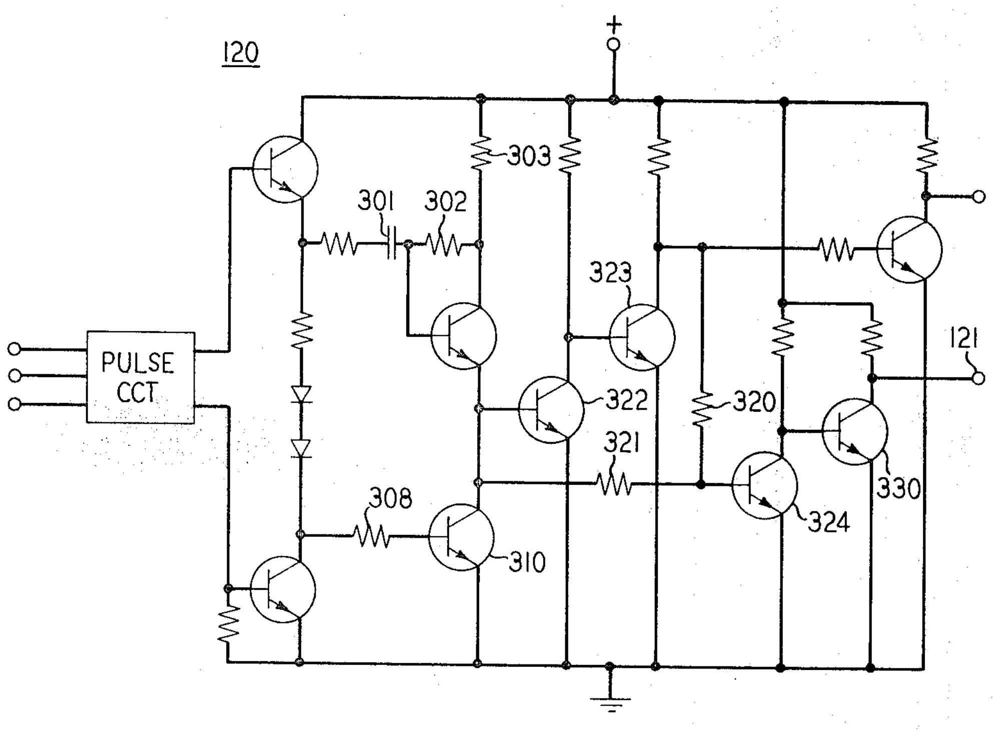
FIG. 3 shows the details of the delay network of FIG. 1.

Signals developed in NAND GATE 115 are applied via circuit path 116 to delay network 120. Delay network 120 should be of a type which selectively delays an input signal characterized by a negative going change of state, i.e., from "1" to "0" while not delaying a signal representative of a positive going change of state, i.e., from "0" to "1". That is to say, negative going input signals are delayed while positive going input signals are propagated without substantial delay. Delay networks of this type are known in the art. Preferably, delay network 120 is further of a type which provides for adjustment of the delay timing interval and which incorporates regenerative action to prevent generation of false output signals in response to power supply ripple or other signals. One such adjustable delay network is depicted in FIG. 3, to be discussed later.

Figure 4:
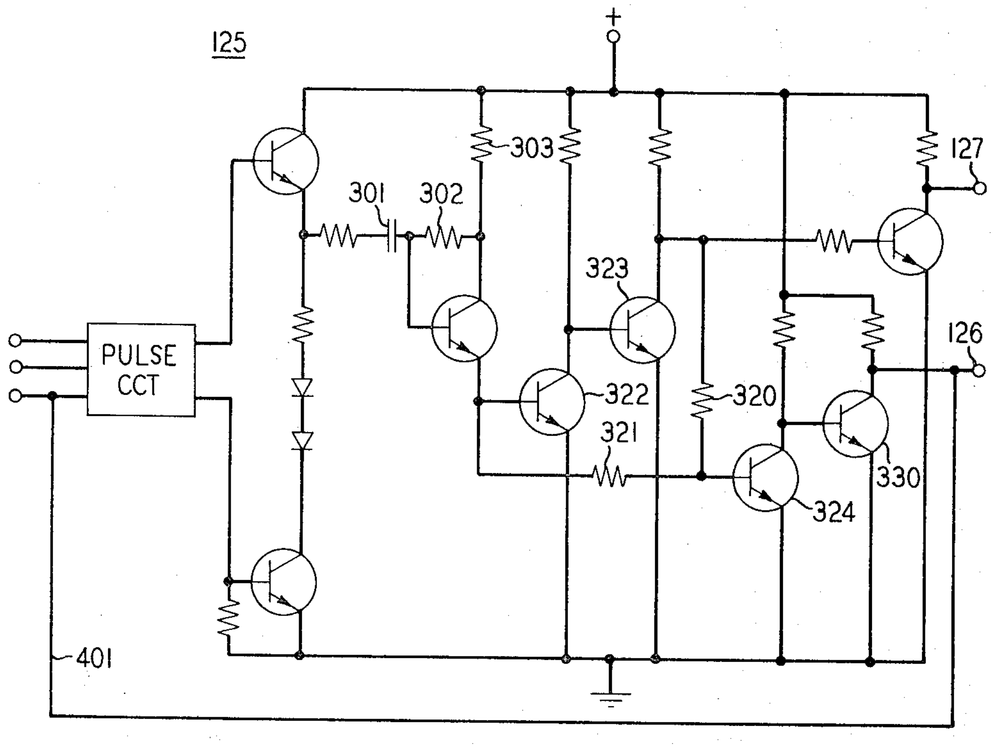
FIG. 4 shows the details of the monostable multivibrator of FIG. 1.

Output signals developed in delay network 120 are supplied to input 111 of NAND GATE 115 via circuit path 122 and to monostable multivibrator 125 via circuit path 121. Monostable multivibrator 125 responds, in well-known fashion, to negative going input signals. Thus, monostable 125 responds only to the negative going signals delayed in network 120. Signals developed at one output of monostable 125, namely, output 126, are supplied to input 112 of NAND GATE 115 via circuit path 128. Signals developed at another output of monostable 125, namely, output 127, are the desired astable multivibrator output signals and may be employed as desired. Utilization of monostable 125 provides isolation between the output circuitry and the oscillator, thereby minimizing frequency variations caused by output loading. Monostable 125 may also take any desired form. It should, however, be of a type which is compatible with NAND GATE 115 and delay network 120, that is, it should have a similar noise margin, and be capable of handling similar signal magnitudes and trigger levels. Preferably, monostable 125 permits the timing interval to be adjusted, and incorporates regenerative action to prevent generation of false output signals. Details of such a monostable network are shown in FIG. 4, to be discussed below.

Figure 2:
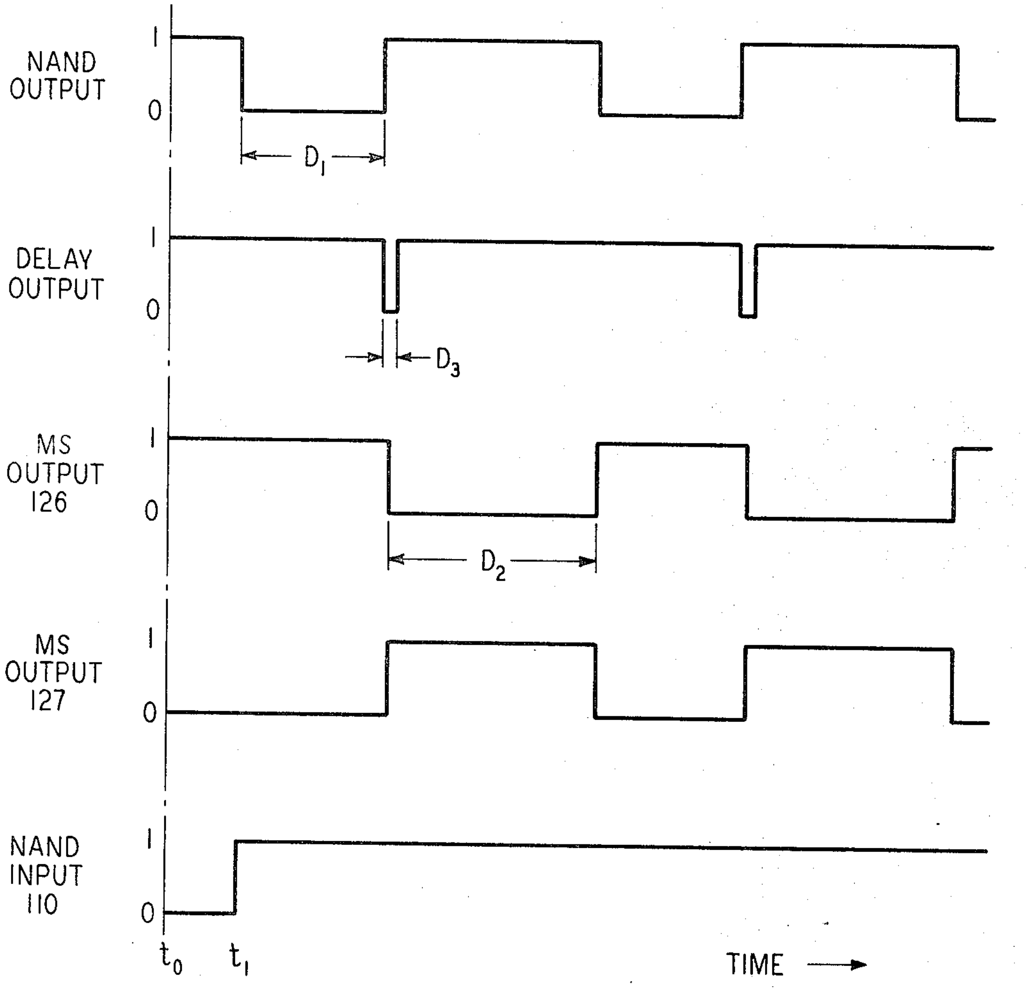
FIG. 2 shows waveforms useful in describing operation of the oscillator of FIG. 1.

Operation of the oscillator of FIG. 1 may best be explained by reference to the sequence of waveforms depicted in FIG. 2. Assuming a signal representative of the "0" state applied to input 110 and NAND GATE 115 at $t_0$, the output of NAND GATE 115 at 116 is in the "1" state, as is the output of delay network 120 and output 126 of monostable 125. Thus, signals representative of the "1" state are applied to inputs 111 and 112 of NAND GATE 115 and a signal developed at output 127 of monostable 125 is representative of the "0" state. Now assuming application of a signal representative of the "1" state to input 110 at $t_1$, the output of NAND GATE 115 goes negative to the "0" state. The signal representing this negative change of state is delayed an interval $D_1$ by delay network 120. Signals developed in delay 120 are applied to input 111 of NAND GATE 115 and to monostable 125. Monostable 125 responds to the delayed negative going signal after a small propagation delay within monostable 125. NAND GATE 115 also responds to the negative going signal, thereby causing its output at 116 to go high, that is, to the "1" state. This positive going signal is propagated through delay network 120 almost instantaneously. That is to say, the positive going signal is developed at 121 shortly after the negative signal. Thus, it is important to delay the positive going signal until monostable 125 has responded to the negative going trigger signal. Otherwise, monostable 125 would not be triggered and NAND GATE 115 and delay 120 would generate oscillatory signals at a very high frequency. Triggering of monostable 125 is insured by adjusting the combined propagation delay of NAND GATE 115 and delay network 120, i.e., delay $D_3$, to be greater than the response time of monostable 125 to the negative going signals. Generally, the internal propagation delays of NAND GATE 115 and delay 120 are sufficient to fulfill this function. The delay, $D_3$, however, may be further controlled by the addition of a small value capacitor, for example, one in the order of 200 pf., to the output of delay 120. Once triggered by a negative going signal, monostable 125 "times" through an astable interval $D_2$, during which signals developed at output 126 are representative of the "0" state, and signals developed at output 127 are representative of the "1" state.

The interval $D_3$, shown in the output waveform of delay network 120, is representative of the combined propagation delays of NAND GATE 115 and delay network 120. As shown, interval $D_3$ is greatly exaggerated; actually it is very small as compared to intervals $D_1$ or $D_2$. Accordingly, interval $D_3$ may be neglected and the period of the astable waveform developed at output 127 is equal to the sum of intervals $D_1$ and $D_2$. Thus, the duration of the "1" state interval of the astable multivibrator of this invention may be precisely controlled by adjustment of the timing elements of monostable 125, while the duration of the "0" state interval may be precisely controlled by adjustment of the timing elements of delay network 120. In practice, output waveforms may be generated having "0" and "1" state intervals of 1 microsecond to 15 seconds.

FIG. 3 shows details of a delay network which may be utilized in the practice of this invention. Basically, network 120 is a pulse timing circuit. It selectively delays an input signal for a fixed duration provided the input signal is of longer duration than the delay interval. Negative going input pulse signals are delayed while positive going input signals are propagated without delay. The desired delay interval is determined by the component values of capacitor 301 and resistors 302 and 303. Transistor 310 and resistor 308 operate to allow output transistor 330 to conduct in response to a negative input signal only after expiration of the timing interval. Transistor 310 also causes output transistor 330 to respond without delay to positive going input signals. Feedback resistors 320 and 321, transistors 322, 323, and 324 and associated circuitry form a regenerative amplifier which provides improved transient response of network 120. A delay network essentially the same as network 120 is described in greater detail in a copending application, E. J. Braun and S. G. Student, Jr., Ser. No. 739,874, filed June 25, 1968. The regenerative amplifier portion of network 120 is described in detail in another copending application, E. J. Braun and S. G. Student, Jr., Ser. No. 747,649, filed July 25, 1968.

FIG. 4 shows the details of monostable multivibrator 125 of the oscillator of FIG. 1. Monostable 125 circuitry is substantially the same as that of delay network 120 except for the exclusion of resistor 308 and transistor 310 (FIG. 3) and the addition of feedback circuit path 401. As in delay 120, the timing interval in monostable 125 is established by capacitor 301 and resistors 302 and 303, and the regenerative action is provided by resistors 320 and 321, and transistors 322, 323 and 324, including associated circuitry. Feedback of signals developed at output 126 of monostable 125 via circuit path 401 causes "latch up" of the monostable outputs for the monostable timing interval. That is to say, a signal developed at output 127 is representative of the "1" state and a signal developed at output 126 is representative of the "0" during the timing interval. Without feedback of output signals in this fashion, monostable 125 would generate a pulse of fixed duration after expiration of the timing interval in response to an input signal having a duration longer than the timing interval. The timing and regenerative portions of monostable 125 are also described in detail in the copending E. J. Braun and S. G. Student, Jr., applications cited above.

What is claimed is:

1. A pulsating signal generating circuit which comprises:

first controllable means responsive to a selected signal characterized by a first change of state for selectively delaying propagation of said signal characterized by said first change of state, and responsive to propagate a signal characterized by a second change of state substantially without delay;

second controllable means for generating a pulsating signal in response to a selected signal supplied from said first means; and logic network means responsive to signals momentarily supplied thereto from said first means and said second means for developing signals characterized by said first change of state and said second change of state in accordance with a selected code of said signals supplied to said logic network.

2. A circuit as defined in claim 1 further including means in circuit relationship with said logic network for selectively inhibiting generation of said pulsating signal.

3. A circuit as defined in claim 1, wherein said first controllable means includes means for selectively adjusting the delay duration, and said second controllable means includes means for selectively adjusting the pulsating signal interval.

4. A circuit as defined in claim 2, wherein said logic network is a NAND GATE having at least two inputs, and said second controllable means is a monostable multivibrator having first and second outputs, one of said outputs yields signals which are supplied to said NAND GATE and the other of said outputs yields said pulsating signal.

5. A circuit as defined in claim 4, wherein said NAND GATE has at least three inputs, and further includes means in circuit relationship with one of said inputs for selectively controllably inhibiting generation of said pulsating signal.

References Cited

UNITED STATES PATENTS

| | | | |
|---|---|---|---|
| 3,317,855 | 5/1967 | Cho | 331—111 |
| 3,350,659 | 10/1967 | Henn | 331—113 |
| 3,382,455 | 5/1968 | Rapp | 331—111 |
| 3,411,107 | 11/1968 | Rees | 331—111 |
| 3,441,872 | 4/1969 | Wagener et al. | 331—113 |
| 3,461,404 | 8/1969 | Kutschbach | 331—111 |

JOHN KOMINSKI, Primary Examiner

U.S. Cl. X.R.

331—113